United States Patent [19]
Eriksson

[11] Patent Number: 6,123,281
[45] Date of Patent: Sep. 26, 2000

[54] YARN FEEDER HAVING AT LEAST ONE YARN SENSOR

[75] Inventor: Anders Eriksson, Taeby, Sweden

[73] Assignee: IRO AB, Ulricehamn, Sweden

[21] Appl. No.: 09/194,462

[22] PCT Filed: May 22, 1997

[86] PCT No.: PCT/EP97/02638

§ 371 Date: Jul. 6, 1999

§ 102(e) Date: Jul. 6, 1999

[87] PCT Pub. No.: WO97/44639

PCT Pub. Date: Nov. 27, 1997

[30] Foreign Application Priority Data

May 23, 1996 [DE] Germany .......................... 196 20 846
Jul. 19, 1996 [DE] Germany ........................ 296 12 565 U

[51] Int. Cl.[7] .................................................. B65H 51/20
[52] U.S. Cl. ...................... 242/364.8; 139/452
[58] Field of Search ............. 242/364.7, 364.8, 242/365.3; 139/452

[56] References Cited

U.S. PATENT DOCUMENTS

| | | | |
|---|---|---|---|
| 4,132,368 | 1/1979 | Schiess et al. | 242/364.8 |
| 4,215,728 | 8/1980 | Weidman et al. | 242/364.8 X |
| 4,226,379 | 10/1980 | Brouwer et al. | 242/364.7 |
| 4,368,854 | 1/1983 | Valois | 242/364.7 |
| 4,374,333 | 2/1983 | Avery | 327/77 |
| 4,676,442 | 6/1987 | Tholander et al. | 242/364.7 |
| 5,119,998 | 6/1992 | Tholander et al. | |
| 5,211,347 | 5/1993 | Riva | 242/364.7 |
| 5,613,528 | 3/1997 | Zenoni et al. | 139/452 |

FOREIGN PATENT DOCUMENTS

| | | |
|---|---|---|
| 0 620 647 A2 | 10/1994 | European Pat. Off. . |
| 0 171 516 B1 | 2/1986 | Germany . |
| 2 276 246 | 9/1994 | United Kingdom . |

OTHER PUBLICATIONS

IBM Technical Disclosure Bulletin dated Mar. 1982, US (2 pages).

*Primary Examiner*—Donald P. Walsh
*Assistant Examiner*—Collin A. Webb
*Attorney, Agent, or Firm*—Flynn, Thiel, Boutell & Tanis, P.C.

[57] ABSTRACT

In order to control a digital sensor S, which by means of a sensor element H responds at least to a variation of a magnetic field M and emits different output signals Y, which are sampled or detected at predetermined points in time t1, t2, t3, the analogue response signal W of the sensor element H being converted by means of a digitising hysteresis switching device T into the output signals Y, the sensor S is switched off and on again at least before the respective output signal Y is detected. The sensor S comprises a clocked interrupter U for switching the sensor S on and off alternately, the clock frequency of the sensor being adapted to the detecting frequency such that the output signal Y can only be detected if the sensor S is switched on before detection. The sensor constitutes a yarn sensor in a yarn feeder F, which comprises a permanent magnet P in a stationary storage drum 13, which permanent magnet P can be moved by the yarn G, and the yarn sensor output signals being converted into control signals for a yarn winding on drive 12 (FIG. 1).

20 Claims, 1 Drawing Sheet

YARN FEEDER HAVING AT LEAST ONE YARN SENSOR

FIELD OF THE INVENTION

The invention relates to a yarn feeder having a sensor element that detects motion of a magnet to control the yarn feeder.

BACKGROUND OF THE RELATED ART

In a yarn feeder according to EP-B-0171 516, yarn sensors are provided for contactless yarn detection, e.g. to generate control signals for the yarn winding on drive, which maintains a yarn store of predetermined size on the storage drum essentially independent from yarn consumption. Said yarn sensor comprises a Hall sensor or proximity sensor with magneto resistive or inductive sensor elements. Such yarn sensor can also be used as a yarn breakage sensor. The yarn moves a permanent magnet, which is movably provided in the storage drum. The yarn sensor is responding to the movement of said permanent magnet or its distance. E.g. digital Hall sensors are available at reasonable costs and operate reliably. However, it is a drawback that the respective output signal change occurs, depending from the motion direction of the permanent magnet or a body of magnetic and/or electromagnetic flux conducting material not at the same distance of the permanent magnet from the sensor element, resulting in inaccurate information with respect to the motion and/or the presence or absence of the yarn, respectively. Since the hysteresis, e.g. of digital Hall sensors, is fluctuating within a production series and since in one and the same yarn feeder several yarn sensors can be provided, until now an inaccurate control behaviour due to the fluctuation of the yarn sensors had to be taken as given, undesireably leading to yarn stores having too big or too small sizes and to disturbances of the operation of the yarn feeder. This is true for Hall elements as well as for magneto resistive or inductive sensor elements as sensor element.

A magnetically activated proximity switch according to EP-A-0 620 647 is surveying the position and the movement of a magnet coupled to an actuating piston. A control circuit comprises a Hall sensor actuated with sufficient voltage by means of a sensor-pulser to carry out an evaluation of the magnetic field. After an evaluation the voltage for the entire sensor is decreased by the sensor-pulser in order to secure the output signal of the sensor.

A Hall effect sensor as known from GB-A-2 276 246 comprises a Hall element, the output of which is connected with a comparator member actuated by a reference voltage in order to digitize the output signal of the Hall element.

It is an object of the invention to create a yarn feeder of the kind as disclosed in which control signals derived from the response of the yarn sensor exactly are corelated to a certain distance between the permanent magnet or body and the sensor element irrespective whether the permanent magnet or body is just approaching the sensor element or is moving away from the sensor element.

SUMMARY OF THE INVENTION

The foregoing objects are achieved by providing the yarn sensor of the invention with an interrupter which is clocked at a clock frequency pattern which alternately switches the sensor element on and off. Thus, the sensor element is switched off and then on again prior to a detection step in a controller.

Due to the interrupter the hysteresis as needed in the yarn feeder for the switching reliability of the yarn sensor looses any influence for the distance detection, since, as a result of switching off and again switching on the yarn sensor prior to the detection of the output signal, it only becomes detected whether the density of the magnetic field has reached the value for the operation point or not, and independent from the motion direction of the body causing the sensor element to respond. The clocked interrupter is responsible to timely switch on and off the yarn sensor. Said yarn sensor cannot only be used to survey the size of the yarn store on the storage drum (minimum and/or maximum sensor, reference sensor) for controlling the winding on drive of the yarn feeder, but instead also as a yarn breakage sensor, generating a switch-off signal or alarm signal in case of a yarn breakage.

The yarn sensor of the yarn feeder is structurally simple. Normally, it is preferred to provide the interrupter between the sensor element, e.g. the Hall element, and the ground.

The interrupter may be a switching transistor, preferably a NPN transistor, high reliability, long duration and an operation with low losses can be achieved.

By proving a capacitor in parallel with the interrupter between the sensor element and a ground, for the yarn sensor in the yarn feeder, switching relationships without disturbing voltage peaks or interferences by electronical noise can be achieved.

Where a microprocessor serves to detect the output signal, a simple design and low costs can be achieved when using a microprocessor for several functions, which microprocessor is integrated into the yarn feeder.

By providing a supply voltage of about +5V, a 1 kΩ resistor, a 100 nF capacitor and a clock frequency of 300 Hz, high precision in the distance detection by means of the yarn sensor can be reached, which is important for the yarn feeder.

Where the yarn sensor comprises a switching member, the switching member produces the hysteresis suitable for the switching reliability. Said hysteresis does not have any influence on the distance detection, since by preceding switching off and switching on of the yarn sensor, the release point of the switching member can be ignored such that it exclusively becomes detected whether the operation point has been reached or not. The output signal change is detected independent from the relative direction of movement between the permanent magnet and the sensor element and always at the same distance.

BRIEF DESCRIPTION OF THE DRAWINGS

Embodiments of the object of the invention will be explained with the help of the drawings.

The drawings are described as follows.

DETAILED DESCRIPTION

Figure 1:
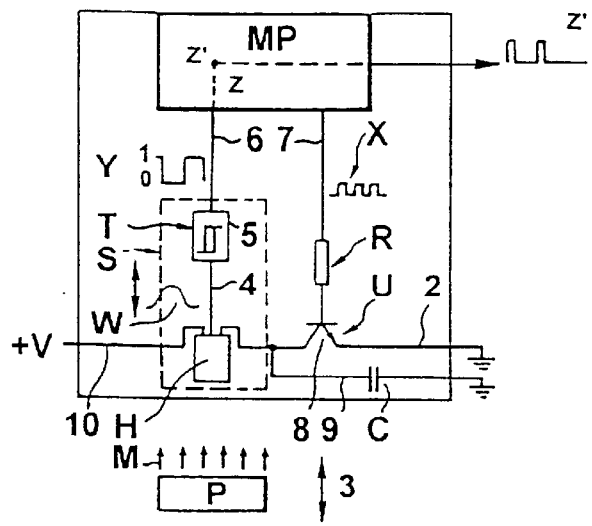
FIG. 1 illustrate a scheme of a digital sensor

A digital sensor S according to FIG. 1 (schematic illustration) contains as main components a sensor element H, e.g. a Hall element, an integrated, digitalizing switching member T operating with hysteresis, an interrupter U as well as an evaluation circuit and a clock, which suitably are constituted by a microprocessor MP. The clock for the clocked interrupter instead could be separated from the evaluation circuit. Moreover, the microprocessor MP could be provided exteriorly of the sensor S and could only be connected with the sensor S to receive signals or to transmit signals, respectively.

The sensor element H, in this case a Hall element, is connected at one input port via a conductor 10 with a voltage source +V, e.g. +5V, while its other input port is grounded via a conductor 2. The response signal of sensor element H is transmitted via a conductor 4 to a switching member T integrated into the sensor S, which switching member T is connected at its output side via a conductor 6 with a contact Z of the microprocessor MP, constituting the evaluation circuit. The switching member T operates with an intentionally provided hysteresis and e.g. is defined by a Schmitt Trigger 5 apt to form digital output signals Y (1 or 0) of analogous response signals W of sensor element H. In conductor 2 the clocked interrupter U is contained, suitably a NPN transistor 8, the base of which is connected via a conductor 7 with the clock generating voltage pulses X, constituted in the shown embodiment by microprocessor MP. In conductor 7 a resistor R can be provided. In a conductor 9 a ground capacitor C can be provided parallel to interrupter U. The junction point of conductor 9 is situated between interrupter U and the input of the sensor element. When the voltage source is about +5V, the resistor preferably is a 1 kΩ resistor and the capacitor is a 100 nF capacitor.

The sensor element H is actuated by a magnetic field M of variable density, e.g. by means of a permanent magnet P moving in the direction of a double arrow 3 in relation to sensor element H. The sensor element H instead could be a magneto resistive sensor element. Of use could be further an inductive sensor element responding to the distance or proximity of a body P of metal or at least containing iron.

The sensor element H outputs (conductor 4) analogous response signals W, depending on the density of the magnetic field M. The switching member T integrated into the sensor S, i.e. the Schmitt Trigger 5, produces digital output signals Y (1 or 0) from said response signals W, which digital output signals Y are scanned or detected at Z in microprocessor MP, from which output signals Y the microprocessor MP is deriving control signals Z'.

The switching member T is switching at the operation point at a predetermined Gauss value of the magnetic field M (approaching of the permanent magnet P towards the sensor element) the output signal Y to a voltage level, corresponding to the value 0. If the density of the magnetic field M is decreasing (the permanent magnet moves away), the switching member T at the release point switches the output signal Y to a high signal level 1, as soon as due to the hysteresis, a Gauss value is reached, which is lower than at the release point. This means that the output signal change from 0 to 1 takes place at another distance between the sensor element H and the permanent magnet P as the output signal change from 1 to 0. By means of the clocked interrupter U, however, one of both output signal changes, e.g. at the release point, becomes eliminated for the detection of the output signal Y by the microprocessor MP because the interrupter U in each case prior to a detection of the output signal Y switches off the sensor element H and again switches on the sensor element H prior to said detection. Due to the switching off, the microprocessor is disabled to detect said one output signal change, e.g. from 1 to 0, but can only detect if said one output signal change, from 0 to 1, has occurred or not. Therefrom follows that the microprocessor only determines if said one output signal change, e.g. from 0 to 1, has already taken place or not, independent from the respective movement direction of the permanent magnet P (double arrow 3).

Figure 2:
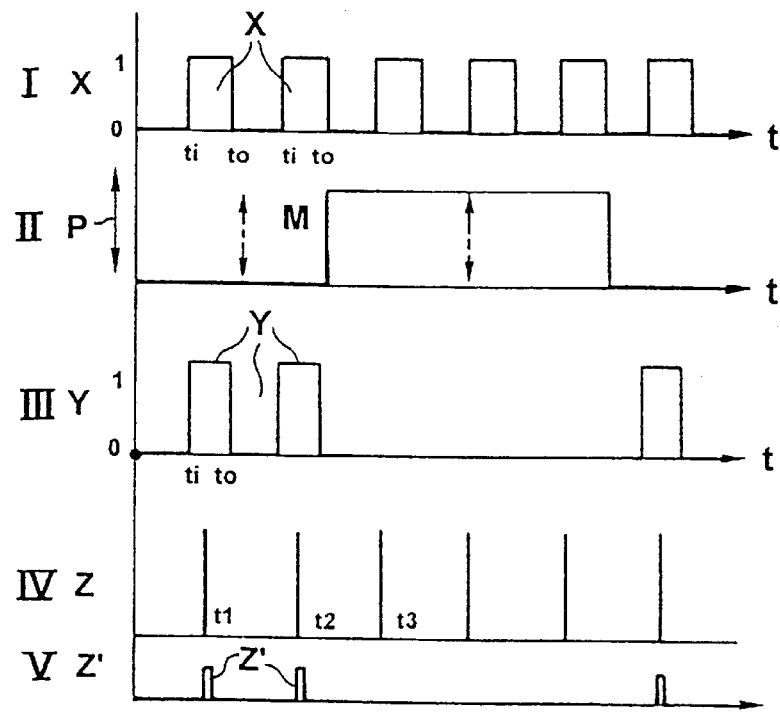
FIG. 2(I) to 2(V) illustrate several time diagrams related to each other.

FIG. 2 illustrates in diagram I the voltage pulses X along the time axis t, by means of which the microprocessor MP is actuating the interrupter U to switch sensor element H on and off. At a respective point „ti" in time, sensor element H becomes switched on until the subsequent point „to" in time at which it is switched off again. Suitably, the times during which the sensor element H is switched on and off are of equal length (frequency e.g. 300 Hz).

The lower diagram II indicates the variation of the magnetic field M above the time axis t or the distance variation of the permanent magnet P, respectively. Diagram III represents the output signals Y above the time axis t during response of sensor element H. As long as the magnetic field M is weak (permanent magnet P is distant from sensor element H) during each switch-on time period (between ti and to) the output signal Y is present with value 1. During the switch-off time period (between to and ti) the output signal Y is present with the value 0. In case that the permanent magnet P has approached the sensor element H sufficiently close, the output signal Y remains at a value 0. In case that permanent magnet P has moved sufficiently far away from sensor element H during the switch-on time period, the output signal Y is present with the high value 1. In diagram IV it is shown how the microprocessor MP at time points t1, t2, t3 detects output signal Y, in which case, however, the time points t1, t2, t3 are respectively within a switch-on time period (ti until to) approximately time-wise in the middle of the switch-on time period. Finally, diagram V indicates how microprocessor MP generates a control signal Z' from the detected output signal at the time points t1, t2, t3 while it does not generate any control signals Z', during the time period the permanent magnet P is close to sensor element H.

Since the output signal Y, which is in diagram III to the right, only then becomes detected when the sensor element H has been switched off and on earlier, it will be ignored that the output signal change (e.g. from 1 to 0) has occurred at another distance between a permanent magnet P and sensor element H than the preceding output signal change (e.g. from 0 to 1).

Figure 3:
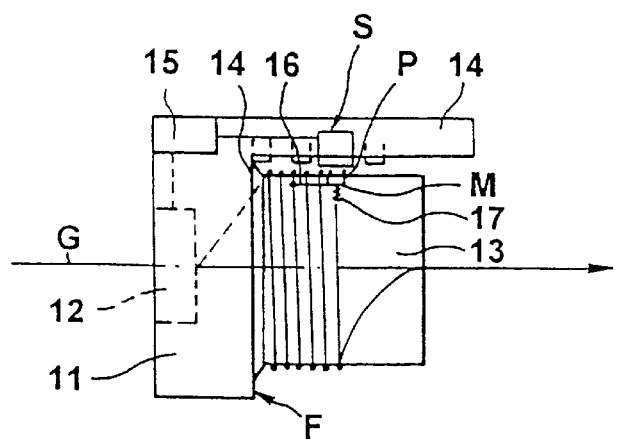
FIG. 3 are schematic yarn feeders having at least one yarn sensor.

The digital sensor according to FIG. 1 is provided in FIG. 3 in a yarn feeder F as a yarn sensor. In housing 11 of said yarn feeder F a winding on drive 12 (an electric motor) is provided, serving to drive a winding on element 14 by which on a stationary storage drum 13 a yarn store consisting of yarn windings can be formed, from which yarn store a not shown textile machine, e.g. a weaving machine, consumes yarn upon demand. Said winding on drive 12 has the task to always maintain a sufficiently big store of the yarn G independent from the consumption by the textile machine, i.e. to assure that said store cannot become too big or too small in size. Within storage drum 13 the permanent magnet P or a body of magnetic and/or electromagnetic flux conducting material is provided on a feeler 16 outwardly biased by a spring 17. Depending on if yarn is present in the region of the permanent magnet P or of said body or not, the permanent magnet P will either have a position retracted into the storage drum 13 or a position projecting beyond said storage drum. By consideration of only one single distance value between the permanent magnet P and the sensor element H, e.g. a Hall element of the yarn sensor S, control signals are transmitted to a control device 15 of the winding on drive 12 in order to drive the winding on drive 12 or to accelerate it for replenishing the yarn store or to stop the winding on drive 12 or decelerate it in order to prevent that the desired size of the yarn store becomes exceeded. The yarn sensor S corresponds to sensor S of FIG. 1 and is apt to emit control signals depending from the fact whether the distance of the permanent magnet P has a precisely predetermined value or not, and particularly independent therefrom whether said permanent magnet P is approaching to the sensor element or is moving away from it.

In dotted lines in FIG. 3 it is indicated that not only a single yarn sensor S can be provided, but occasionally further equal yarn sensors, or even a yarn breakage sensor.

What is claimed is:

1. A yarn feeder comprising a stationary storage drum, a yarn winding-on element which winds yarn onto said storage drum in windings, a yarn winding-on drive which drives said winding-on element, and at least one yarn sensor disposed a distance from said storage drum to detect said yarn on said storage drum, said yarn sensor having a sensor element which is directed toward a magnetic field of a flux conducting body wherein said flux conducting body is a magnetic or an electromagnetic material that generates said magnetic field, said flux conducting body being movable between positions close to said sensor element and remote from said sensor element depending on the presence or absence on or a movement of said yarn along said storage drum, said yarn sensor periodically emitting output signals during periodic detection times having a detection frequency pattern such that said yarn sensor generates control signals which control said yarn winding-on drive of said yarn feeder, said yarn sensor further comprising an interrupter which is connected to said yarn sensor to switch said yarn sensor on and off, said interrupter being clocked by a clock according to a predetermined clock frequency pattern which corresponds to said detection frequency pattern so that said yarn sensor is alternately switched on and off during continued operation of said yarn feeder, said interrupter being actuated according to said clock frequency pattern so that a respective one of said output signals exclusively is generated during one of said detection times after said yarn sensor has been first switched off and then on.

2. The yarn feeder according to claim 1, wherein said interrupter is connected to said clock, and is provided between said sensor element and a ground or between said sensor element and a voltage source.

3. The yarn feeder according to claim 2, wherein said sensor element is a Hall element of a Hall sensor, a magnetic resistive element or an inductive sensor element.

4. The yarn feeder according to claim 2, wherein said interrupter is a switching transistor to the basis of which a pulse generator for voltage pulses is connected as said clock.

5. The yarn feeder according to claim 4, wherein said switching transistor is a NPN transistor.

6. The yarn feeder according to claim 4, wherein a capacitor is provided in parallel to said interrupter and is arranged between said sensor element and said ground, said capacitor being connected to said ground and a resistor being provided between said interrupter and said pulse generator.

7. The yarn feeder according to claim 4, wherein said pulse generator is provided in a microprocessor which serves to detect said output signals.

8. The yarn feeder according to claim 1, wherein at a supply voltage of about +5V, a resistor of 1 kΩ and a capacitor of 100 nF are provided, said clock frequency being about 300 Hz.

9. The yarn feeder according to claim 1, wherein said yarn sensor comprises a switching member having a hysteresis to digitize a response signal of said sensor element into different output signals, said switching member being connected with a microprocessor in order to detect or sample said output signals at predetermined points in time during said detection steps.

10. The yarn feeder according to claim 9, wherein said switching member is a Schmitt Trigger.

11. A yarn feeder comprising a stationary storage drum, a yarn winding-on element which winds yarn onto said storage drum in windings, a yarn winding-on drive which drives said winding-on element, and at least one yarn sensor disposed a distance from said storage drum to detect said yarn on said storage drum, said yarn sensor having a sensor element which is directed toward a magnetic field of a flux conducting body wherein said flux conducting body is a magnetic and or an electromagnetic material that generates said magnetic field, said flux conducting body being movable between positions close to said sensor element and remote from said sensor element depending on the presence or absence on or a movement of said yarn along said storage drum, said yarn sensor periodically emitting output signals during periodic detection times having a detection frequency such that said yarn sensor generates control signals which control said yarn winding-on drive of said yarn feeder, said yarn sensor further comprising an interrupter which is connected to said yarn sensor to switch said yarn sensor on and off, said interrupter being clocked by a clock according to a predetermined clock frequency pattern which corresponds to said detection frequency pattern so that said yarn sensor is alternately switched on and off during continued operation of said yarn feeder, said interrupter being actuated according to said clock frequency pattern so that a respective one of said output signals exclusively is generated during a respective one of said detection times after said yarn sensor has been first switched off and then on, said interrupter being a switching transistor to the basis of which a pulse generator for voltage pulses is connected as said clock.

12. The yarn feeder according to claim 11, wherein said interrupter is provided between said sensor element and a ground or between said sensor element and a voltage source.

13. The yarn feeder according to claim 12, wherein said sensor element is a Hall element of a Hall sensor, a magnetic resistive element or an inductive sensor element.

14. The yarn feeder according to claim 11, wherein said switching transistor is a NPN transistor.

15. The yarn feeder according to claim 11, wherein a capacitor is provided in parallel to said interrupter and is arranged between said sensor element and said ground, said capacitor being connected to said ground and a resistor being provided between said interrupter and said pulse generator.

16. The yarn feeder according to claim 11, wherein said pulse generator is provided in a microprocessor which serves to detect said output signals and generate said control signals.

17. The yarn feeder according to claim 11, wherein at a supply voltage of about +5V, a resistor of 1 kΩ and a capacitor of 100 nF are provided, said clock frequency being about 300 Hz.

18. The yarn feeder according to claim 11, wherein said yarn sensor comprises a switching member having a hysteresis to digitize a response signal of said sensor element into different output signals, said switching member being connected with a microprocessor in order to detect or sample said output signals at predetermined points in time during said detection steps.

19. The yarn feeder according to claim 18, wherein said switching member is a Schmitt Trigger.

20. A yarn feeder comprising a stationary storage drum, a yarn winding-on element which winds yarn onto said storage drum in windings, a yarn winding-on drive which drives said winding-on element, and at least one yarn sensor disposed a distance from said storage drum to detect said yarn on said storage drum, said yarn sensor having a sensor element which is directed toward a magnetic field of a flux conducting body wherein said flux conducting body is one of a magnetic and an electromagnetic material that generates said magnetic field, said flux conducting body being movable between positions close to said sensor element and remote from said sensor element depending on the presence or absence on or a movement of said yarn along said storage drum, said yarn sensor periodically emitting output signals during periodic detection times having a detection frequency such that said yarn sensor generates control signals for said yarn winding-on drive of said yarn feeder, said yarn sensor further comprising an interrupter which is connected to said yarn sensor to switch said yarn sensor on and off, said interrupter being clocked by a clock according to a predetermined clock frequency pattern which corresponds to said detection frequency pattern so that said yarn sensor is alternately switched on and off during continued operation of said yarn feeder, said interrupter being actuated according to said clock frequency pattern so that a respective one of said output signals exclusively is generated during one of said detection times after said yarn sensor has been first switched off and then on, said yarn sensor comprising a switching member having a hysteresis for digitizing a response signal of said sensor element into different output signals, said switching member being connected with a microprocessor in order to detect or sample said output signals at predetermined points in time during said detection times.

* * * * *